(12) United States Patent
Trobough et al.

(10) Patent No.: US 7,248,036 B2
(45) Date of Patent: Jul. 24, 2007

(54) METHOD AND APPARATUS TO PROBE BUS SIGNALS USING REPEATERS

(75) Inventors: Mark B. Trobough, Olympia, WA (US); Richard Glass, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 10/857,653

(22) Filed: May 27, 2004

(65) Prior Publication Data

US 2005/0264277 A1    Dec. 1, 2005

(51) Int. Cl.
*G01R 31/28* (2006.01)
(52) U.S. Cl. .................................. 324/158.1
(58) Field of Classification Search ............... 324/763, 324/760, 765, 158.1; 361/734; 439/66; 714/724–737
See application file for complete search history.

(56) References Cited

U.S. PATENT DOCUMENTS

| | | | |
|---|---|---|---|
| 5,309,324 A * | 5/1994 | Herandez et al. ............ 361/734 |
| 6,178,629 B1 * | 1/2001 | Rathburn ..................... 29/843 |
| 6,331,770 B1 * | 12/2001 | Sugamori ................ 324/158.1 |
| 6,653,855 B2 * | 11/2003 | Mori et al. ................. 324/763 |
| 6,788,081 B2 * | 9/2004 | Brunelle et al. ............ 324/755 |

* cited by examiner

*Primary Examiner*—Ha Tran Nguyen
*Assistant Examiner*—Tung X. Nguyen
(74) *Attorney, Agent, or Firm*—Blakely, Sokoloff, Taylor & Zafman LLP

(57) ABSTRACT

An assembly including a processor socket having a cut region. The assemble further including a probe board having a repeater positioned in alignment with the cut region. The repeater is to receive at least a first signal. The repeater is to tap the first signal. The tapped first signal is to be transmitted to a first device. The repeater is also to reinject the first signal, and the reinjected first signal to be transmitted to a processor.

17 Claims, 5 Drawing Sheets

METHOD AND APPARATUS TO PROBE BUS SIGNALS USING REPEATERS

FIELD OF INVENTION

The field of invention relates generally to probing bus signals using repeaters.

BACKGROUND

At the lower bus speeds of today's processors, the current methodology to gain observe-ability of the bus signals is to install a probe interposer assembly 102 between the processor socket 104 and the motherboard socket 106, as illustrated in FIG. 1. The interposer assembly is typically wired to "tap-off" a small amount of energy from each bus signal such that the actual bus is minimally perturbed and may operate normally at full speed. The small amount of energy which gets "tapped off" for each signal in the interposer assembly is routed by cable 108 to components which recover those signals and allow them to be conditioned to make them coherent for purposes of analyzing what is happening on the bus when failures occur.

Improvements in the bus observe-ability/probing methodology are desired in view of the higher bus speeds in development today, which "break" the current "tap-off" bus observe-ability/probing methodology.

DETAILED DESCRIPTION

An improved method and apparatus to probe bus signals using repeaters is described. In one embodiment, bus signals are intercepted and routed to a signal repeater device, which is located in a cut out region of a processor socket such that the added signal lengths due to probing are reduced.

In the following description, numerous specific details are set forth. However, it is understood that embodiments may be practiced without these specific details. In other instances, well-known circuits, structures and techniques have not been shown in detail in order not to obscure the understanding of this description.

Reference throughout this specification to "one embodiment" or "an embodiment" indicate that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
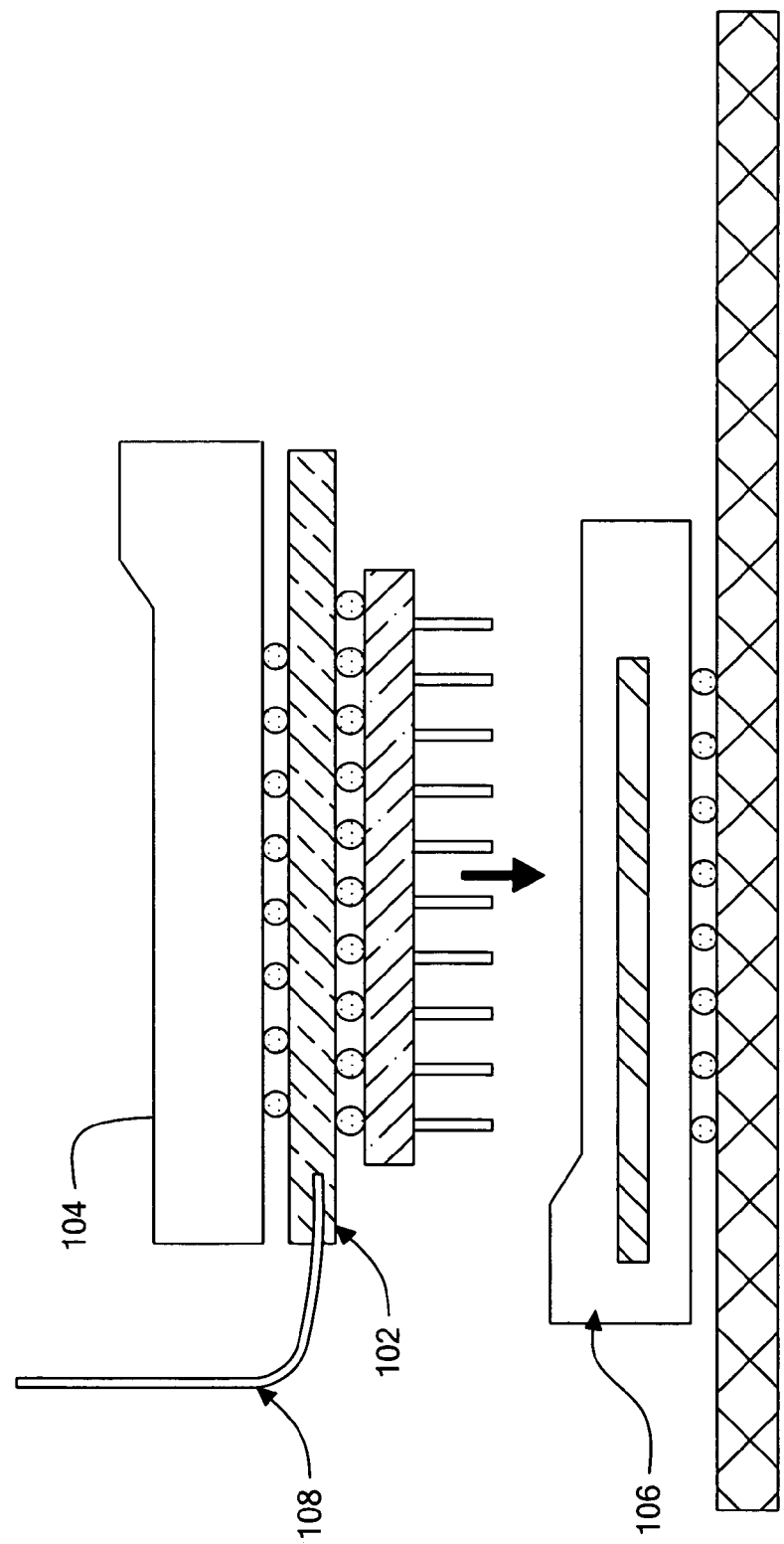
FIG. 1 illustrates a diagram of a probe interposer assembly to provide observe-ability of the bus signal.
Figure 2:
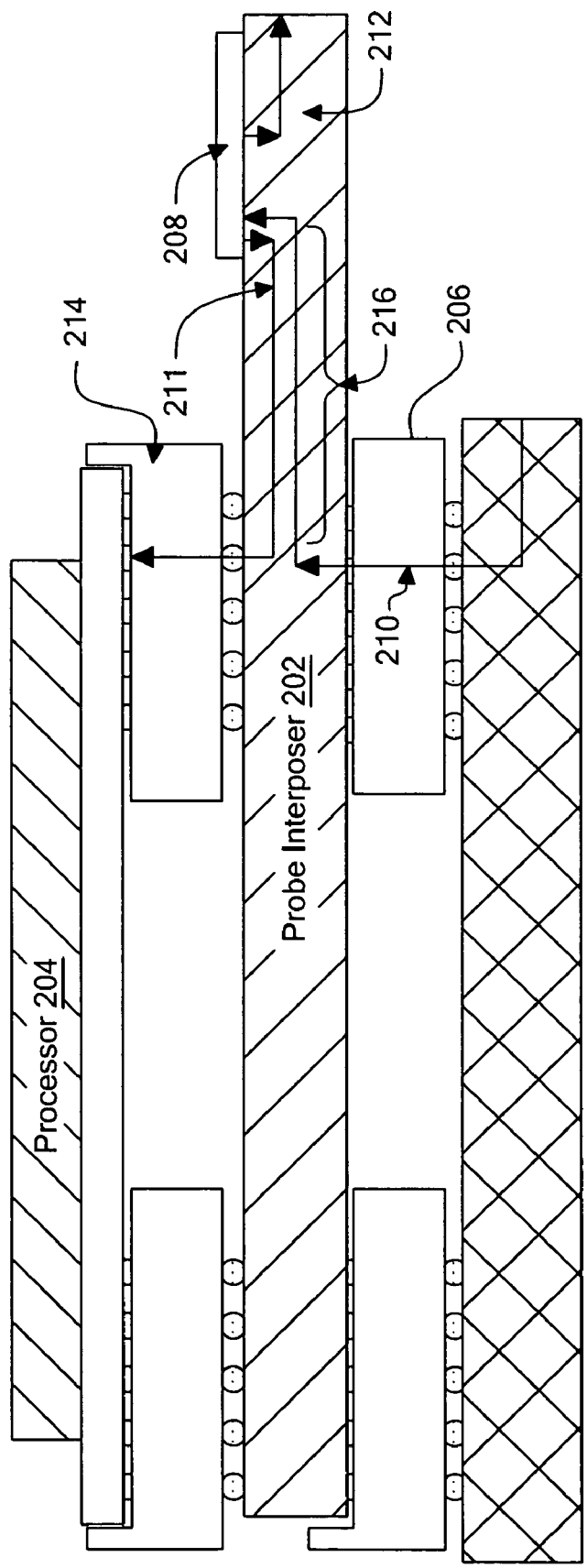
FIG. 2 illustrates a bus observe-ability/probing technique using signal repeaters.

Because the higher bus speeds in development today "break" the current "tap-off" bus observe-ability/probing methodology, bus observe-ability/probing methodology using signal repeaters are used to address the higher speeds. As illustrated in FIG. 2, a repeater-based bus observe-ability probe 202 intercepts the bus signals 210 after the signal travels thru a motherboard socket 206, and routes the signals to a repeater device 208 on the probe 202. The repeater "taps" the signals 210 and the tapped signal 212 is sent to the test equipment (such as a Logic Analyzer). The repeater 208 drives/re-injects signal 211 back into the processor 204 via the interposer 202 thru a processor socket 214 on the probe.

However, when an interposer probe is implemented between the mother board socket 206 and the processor socket 214, the routed lengths 216 in the probe from the bus signal interrupt point to the repeater device 208 adds length to the bus signals, and therefore adds risk of rendering the bus signals inoperative if they are operating at or near their margin. FIG. 2 shows a typical repeater-based interposer where the repeater device 208 is shown as it would typically be assembled onto the probe 202 (outside of and away from the processor socket mounted on the probe board 202) and illustrates the added bus lengths 216 imposed by that typical approach.

Figure 3:
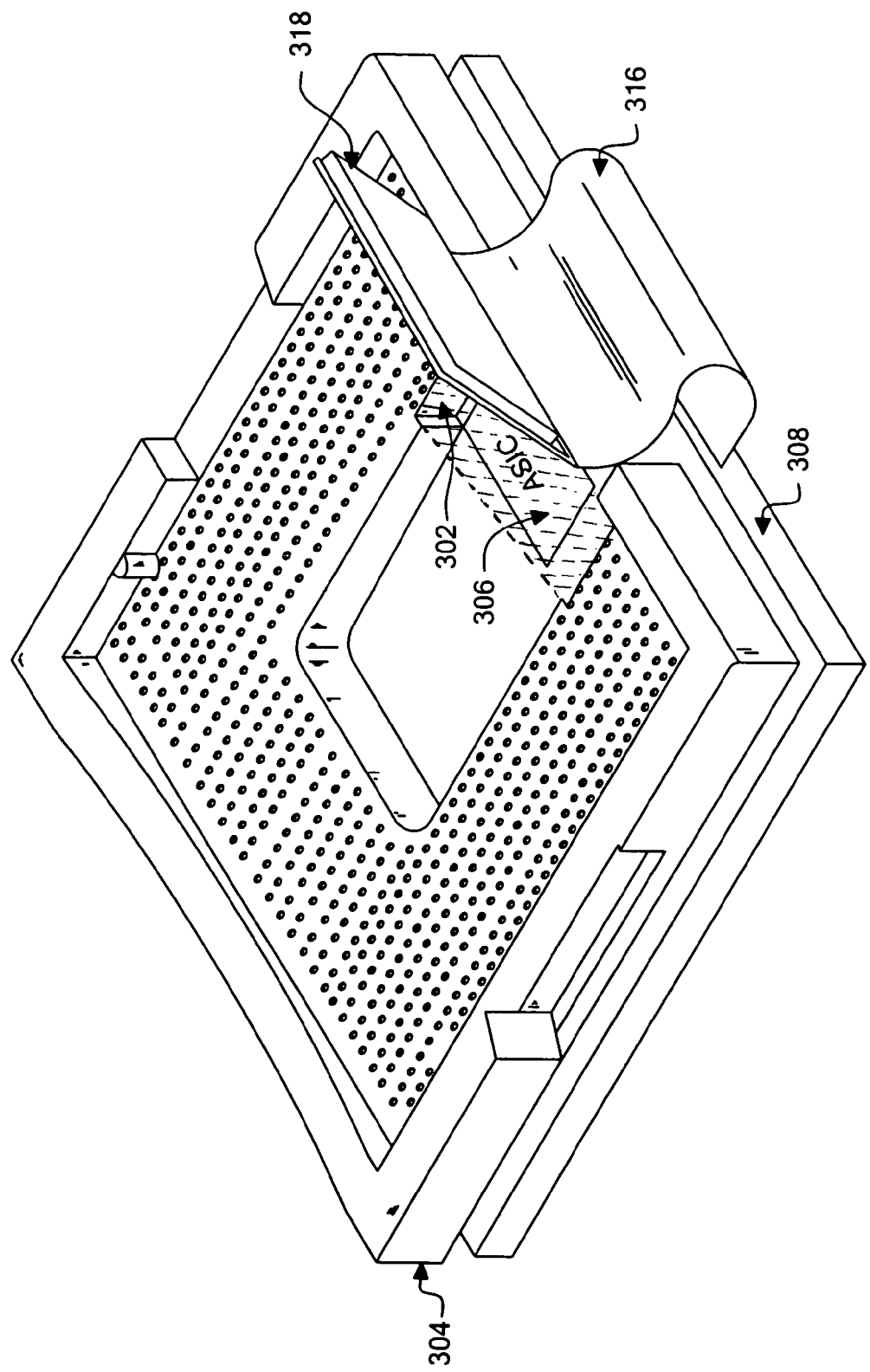
FIG. 3 illustrates a probe interposer assembly using a repeater, in accordance with one embodiment.

As illustrated in FIG. 3, a region/cavity 302 of a processor socket 304 is removed where the bus signals of interest reside. Removing the region 302 of the processor socket 304 allows for placement of a repeater 306 on the probe board 308 to reduce added signal lengths due to probing, as described in more detail below. In one embodiment, the processor socket 304 is a Land Grid Array (LGA) socket, and the repeater 306 is an Application Specific Integrated Circuit (ASIC) repeater. Variations of the processor socket and the repeater may be used in alternative embodiments.

Figure 4:
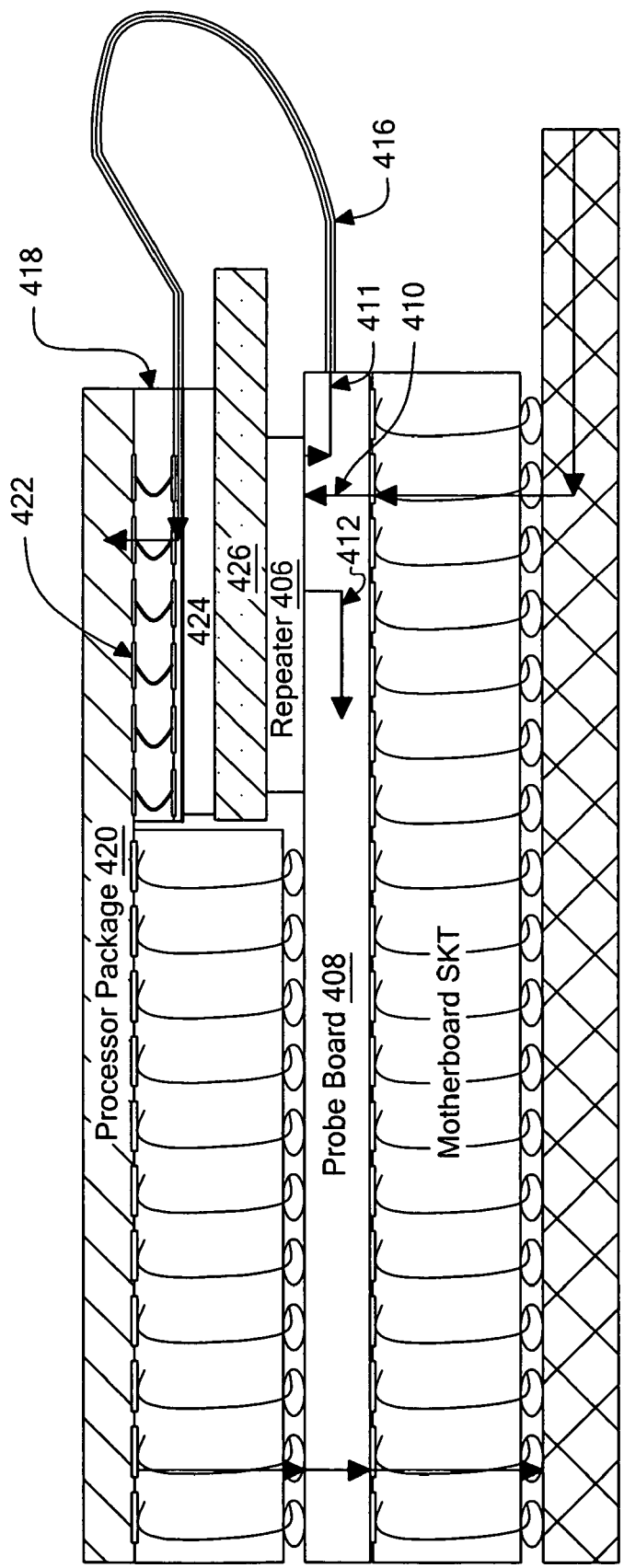
FIG. 4 illustrates a cutaway view of a probe interposer assembly using a repeater, in accordance with one embodiment.

As illustrated in the cross-sectional view of FIG. 4, in one embodiment, the signals 410 of interest coming from a remote device (such as a chipset) via the motherboard are intercepted at the probe board 408. In one embodiment, the probe board intercepts the bus signals at a location that is very near the repeater device 406, to reduce the added bus length needed to route the bus signals to the repeater device.

After being intercepted at the probe board 408, the signals 410 are routed a short distance to the repeater 406 where the signal 410 is recovered by an input receiver on the repeater 406. The signal 410 is "tapped" in the repeater, and the tapped signal 412 may be sent to a piece of test equipment such as a logic analyzer. The signal 411 is also "re-injected" into the probe board 408 via an output driver of the repeater 406.

In one embodiment, the re-injected signal 411 is to be routed via an integrated flex circuit 416. The flex circuit 416, as illustrated in FIG. 3, flexes into the "cut" region 302 of the processor socket 304 and aligns/interconnects to the processor package lands using, in one embodiment, a low-profile LGA connector 318. In alternative embodiments, a number of alternative technologies could also be used in place of the low profile LGA connector.

In one embodiment, the low-profile LGA connector 318 may be pre-soldered to the integrated flex, or may be a separate element. In an alternative embodiment, the integrated flex could be hand-soldered to the processor package directly (i.e., without a low-profile LGA connector in between).

As illustrated in FIG. 4, when a low-profile LGA connector 418 is used, considering pressure will be used to make the interconnect between the flex circuit 416 and the processor package lands 422 via the low-profile LGA connector 418, a compliant pressure pad 424 (such as an elastomer) may be used. When the assembly is compressed, adequate pressure is to be applied to the low-profile connector to make a reliable interconnect.

In addition, if the repeater device 406 requires cooling, a cold-plate, heat pipe, or other solution may be included. For example, in one embodiment, as illustrated in FIG. 4, a cold-plate 426 may be placed over the repeater 406.

Figure 5:
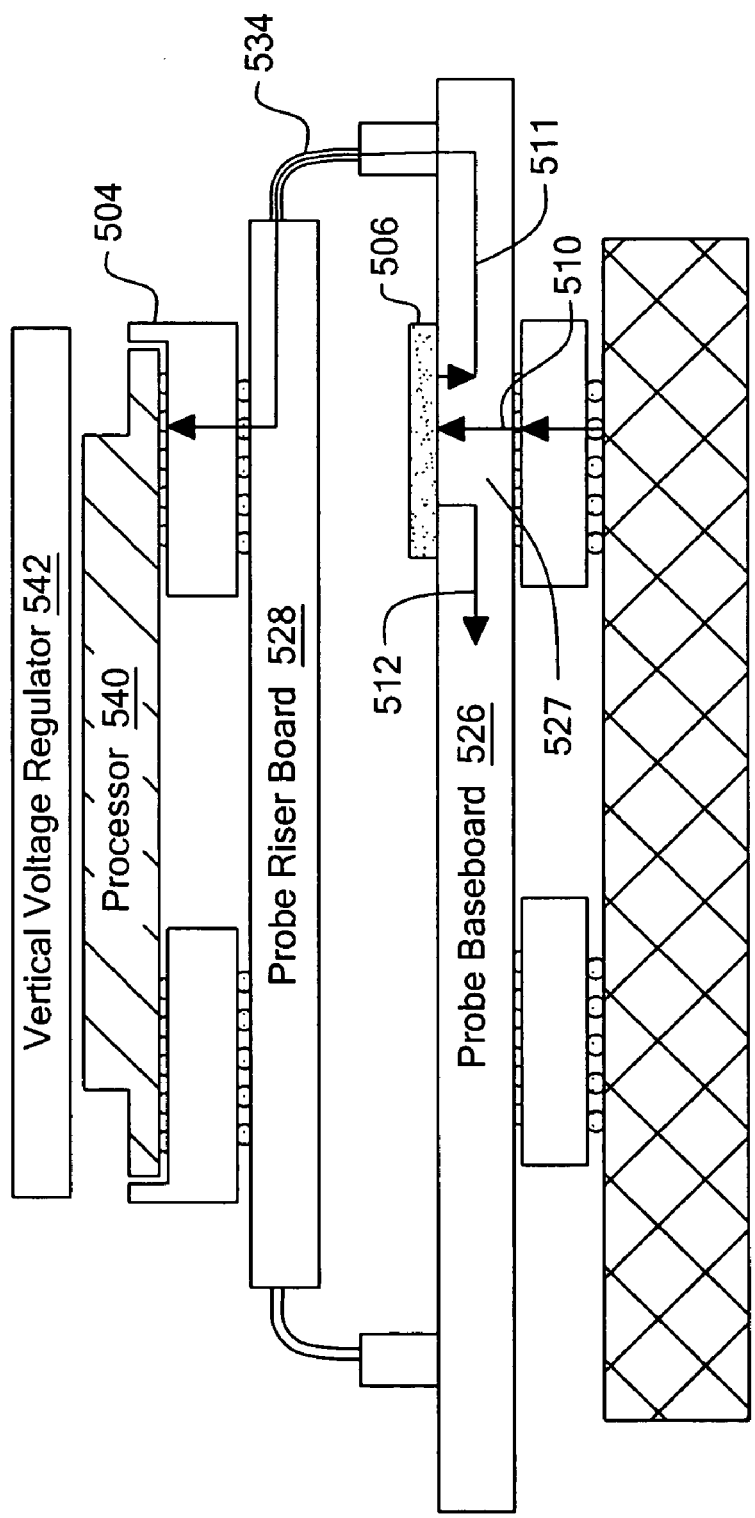
FIG. 5 illustrates a probe interposer assembly using a repeater, in accordance with an alternative embodiment.

For certain processors, as illustrated in FIG. 5, power may be delivered thru the top of a processor 540 from a vertically integrated voltage regulator 542. As such, in an alternative embodiment, the probe board is provided in two halves of an assembly. In one embodiment, as further illustrated in FIG. 5, the two parts of the probe assembly include a probe baseboard 526 and processor riser board 528. The two assemblies electromechanically assemble together to form the probe assembly, in one embodiment.

In one embodiment, as further illustrated in FIG. 5, the probe base board 526 includes the repeater device 506 located where the socket-interface half of the probe resides 527, to reduce added bus lengths needed to route signals 510 coming through the baseboard 526 to the repeater 506. The signal 510 is "tapped" in the repeater 506, and the tapped signal 512 may be sent to a piece of test equipment such as a logic analyzer. The signal 511 is also "re-injected" into the probe baseboard 526 via an output driver of the repeater 506. In addition, connectors and/or cables or some other interconnect mechanism 534 are provided to route the re-injected signals 511 from the probe base board 526 to the processor 540 located in a processor socket 504 on the probe riser board 528.

In the foregoing specification, the invention has been described with reference to specific exemplary embodiments thereof. It will, however, be evident that various modifications and changes may be made thereto without departing from the broader spirit and scope of the invention as set forth in the appended claims. For example, the above described thermal management technique could also be applied to desktop computer device. The specification and drawings are, accordingly, to be regarded in an illustrative rather than a restrictive sense.

The invention claimed is:

1. An apparatus comprising:
 a processor socket having a cut out region;
 a probe board having a repeater positioned within the cut out region, the repeater to intercept at least a first signal destined for a processor, transmit the intercepted first signal to a test device, and reinject the intercepted first signal for routing to the processor.

2. The apparatus of claim 1, wherein the first signal is a bus signal.

3. The apparatus of 1, wherein the processor socket is a Land Grid Array socket.

4. The apparatus of 2, wherein the repeater is an Application Specific Integrated Circuit.

5. The apparatus of claim 1, wherein the test device is a logic analyzer.

6. The apparatus of claim 1, further comprising a flex circuit to route the reinjected first signal to the processor.

7. The apparatus of claim 6, wherein the flex circuit is integrated in the probe board at a first end of the flex circuit.

8. The apparatus of claim 7, wherein an LGA connector is coupled to a second end of the flex circuit, the LGA connector is to be inserted between the processor and the repeater.

9. The apparatus of claim 6, further comprising a repeater cooling unit and a pressure pad interposed between the repeater and an LGA connector of the flex circuit.

10. An assembly comprising:
 a cavity in a processor socket;
 a repeater positioned within the cavity; and
 a probe board to intercept at least a first signal destined for a processor, the probe board to pass the intercepted first signal to the repeater, and the repeater to transmit the intercepted first signal to a test device and to reinject the intercepted first signal for routing to the processor.

11. The assembly of claim 10, wherein the first signal is a bus signal.

12. The assembly of claim 10, wherein the processor socket is a Land Grid Array socket.

13. The assembly of claim 10, wherein the repeater is an Application Specific Integrated Circuit.

14. The assembly of claim 10, wherein the test device is a logic analyzer.

15. The assembly of claim 10, further comprising a flex circuit to route the reinjected first signal to the processor.

16. The assembly of claim 15, wherein the flex circuit is integrated in the probe board at a first end of the flex circuit, and an LGA connector is coupled to a second end of the flex circuit, the LGA connector is to be inserted between the processor and the repeater.

17. The assembly of claim 15, further comprising a repeater cooling unit and a pressure pad interposed between the repeater and an LGA connector of the flex circuit.

* * * * *

UNITED STATES PATENT AND TRADEMARK OFFICE
CERTIFICATE OF CORRECTION

PATENT NO. : 7,248,036 B2 Page 1 of 1
APPLICATION NO. : 10/857653
DATED : July 24, 2007
INVENTOR(S) : Trobough et al.

It is certified that error appears in the above-identified patent and that said Letters Patent is hereby corrected as shown below:

In column 1, at line 32, delete "signal" and insert --signals--.

Signed and Sealed this

Fifteenth Day of April, 2008

JON W. DUDAS
*Director of the United States Patent and Trademark Office*